Figure 1:
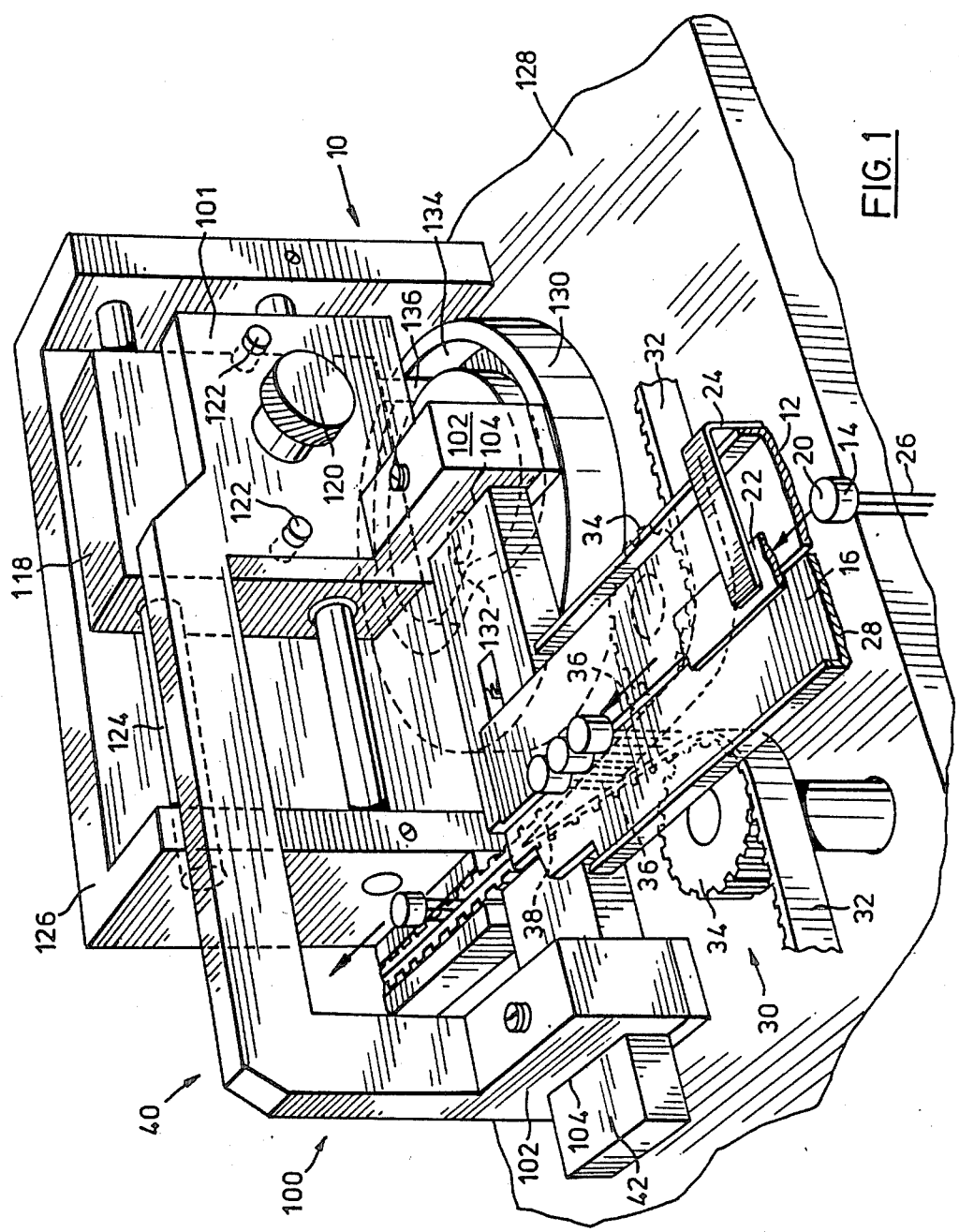

United States Patent [19]

Storimans

[11] Patent Number: 4,700,753

[45] Date of Patent: Oct. 20, 1987

[54] ELECTRONIC COMPONENT SPACER MECHANISM

[75] Inventor: Franciscus J. A. Storimans, Gormley, Canada

[73] Assignee: GPD Canada Inc., Gormley, Canada

[21] Appl. No.: 899,310

[22] Filed: Aug. 22, 1986

[51] Int. Cl.[4] .............................................. B21F 23/00
[52] U.S. Cl. ..................................... 140/147; 198/459
[58] Field of Search ................ 140/105, 147; 198/459, 198/530, 531

[56] References Cited

U.S. PATENT DOCUMENTS

| | | | |
|---|---|---|---|
| 3,520,335 | 7/1970 | Patterson | 140/147 |
| 3,945,408 | 3/1976 | Halligan | 140/105 |
| 4,387,500 | 6/1983 | Weresch | 140/105 |
| 4,502,215 | 3/1985 | Davis et al. | 140/147 |

Primary Examiner—Lowell A. Larson
Attorney, Agent, or Firm—Fetherstonhaugh & Co

[57] ABSTRACT

A spacer for spacing the leading component of a single file column of electronic components from the following component as the components are advanced by a feeder along a path which extends to a pick-off point of a component handling machine, each electronic component having a body portion and lead wire means projecting from the body portion below the feeder.

13 Claims, 11 Drawing Figures

ELECTRONIC COMPONENT SPACER MECHANISM

FIELD OF INVENTION

This invention relates to machines for handling electronic components including lead forming machines and taping machines. In particular, this invention relates to a spacer for spacing electronic components as they are fed into a component handling machine.

In my prior U.S. application, Ser. No. 822,635 filed Jan. 27, 1986, now U.S. Pat. No. 4,650,060 granted Mar. 17, 1987, I have described a feed conveyor for a machine for forming the leads of electronic components which includes a conveyor belt which is pinched in order to engage the leads of the components and a component feeder mechanism for feeding the components one at a time to the pick-off point. This mechanism is suitable for use in association with electronic components which include a body portion which is stable when mounted in a slide and serves to space the leads of successive components from one another. The spacer mechanism engages the body portion of the component and does not make contact with the lead portions.

When attempting to mechanically manipulate components, difficulty is experienced because the lead wires which are ductile tend to bend very easily and are not uniformly straight or parallel when delivered along a feeder mechanism to the pick-off point of a manipulator mechanism. Furthermore, with some components such as diodes, the body portions are in the form of circular discs which extend in the same plane as the leads and do not present a flat supporting surface to the feeder mechanism so as to ensure that the leads will extend directly downwardly. As a result of the shape of the body portion of the components, the body portion of adjacent leads tend to overlap one another in the feeder mechanism and as a result, it is difficult to separate the leading component from the next following component. Furthermore, because the lead wires also tend to overlap one another, it is difficult to separate the lead wires of the leading component from the lead wires of the next following component.

In addition, because of the irregularity of the lead wires of the components, subsequent forming of the components is made difficult because of the difficulty in aligning the leads with the forming tools.

SUMMARY OF INVENTION

To overcome the difficulties previously encountered in attempting to separate the leading component from the leading component from the next following component, I provide a shuttle member which extends transversely of the path of travel of the components and is located directly below and in close proximity to the slide along which the components travel such that the shuttle will operate to separate the lead wires of the leading component from the lead wires of the next following component.

In order to straighten or correctly align the lead wires of the components, a lead straightening device is provided on the shuttle which serves to engage and straighten the leads before the components are removed from the pick-off point.

It is an object of the present invention to provide a simple and efficient spacer mechanism for spacing a leading component of a single file column of electronic components from the next following component by separating the lead wire means of the leading component from the lead wire means of the next following component.

It is a further object of the present invention to provide a lead straightening mechanism in the spacer mechanism for straightening and aligning the leads of electronic components prior to removal from the pick-off point.

According to one aspect of the present invention there is provided a spacer for spacing the leading component of a single file column of electronic components from the following component as the components are advanced by a feeder along a path which extends to a pick-off point of a component handling machine, each electronic component having a body portion and lead wire means projecting from the body portion below the feeder, said spacer comprising a shuttle mounted below and located adjacent said feeder for reciprocating movement across said path between a first position and a second position, said shuttle having an upstream end and a downstream end spaced from the advancing column of components, a first stop on said shuttle arranged to extend across said path to stop the advance of said next following component at a first point as said shuttle moves from its first position to its second position and back to its first position, a second stop on said shuttle arranged to extend across said path when said shuttle is in said first position, to stop the advance of said leading component at a second point which is located downstream of said first point, a passage opening through said shuttle to permit passage of the leading component from said first point to said pick-off point, said passage having a first angularly inclined face arranged to engage the lead wire means of a leading component located at said second point as said shuttle moves from its first position to its second position to advance said leading component from said second point to said pick-off point to space it from the next following component.

According to a further aspect of the present invention, there is provided in a spacer mechanism of the type described in the preceding paragraph, a lead straightening means located in the through passage downstream of the first angularly inclined face, the straightening means being arranged to bear against the lead means of the leading component to apply a straightening load thereto when the shuttle is in its second position.

Figure 3:
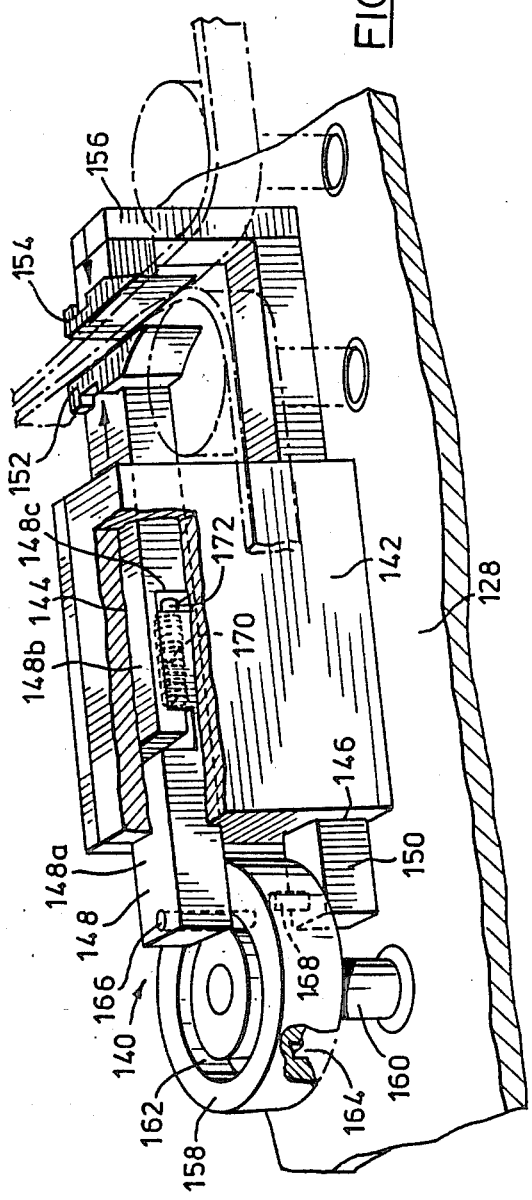
Figure 2:
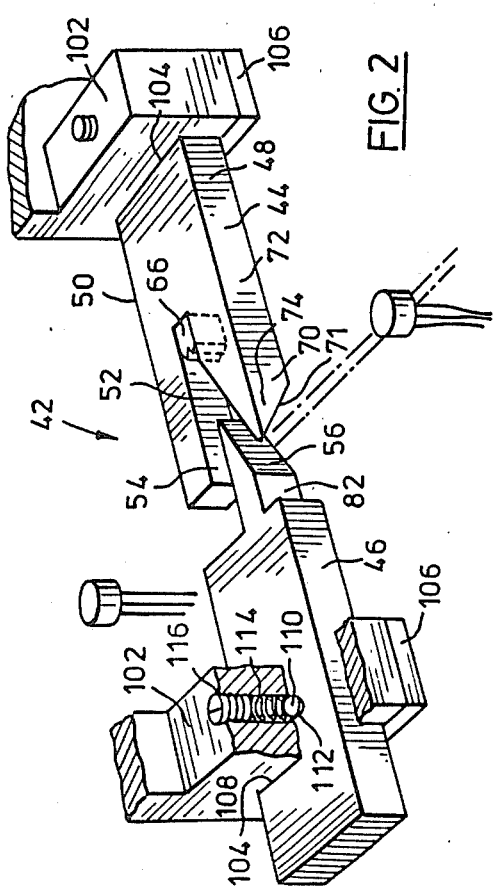
Figure 4:
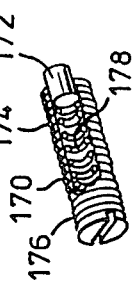
Figure 5:
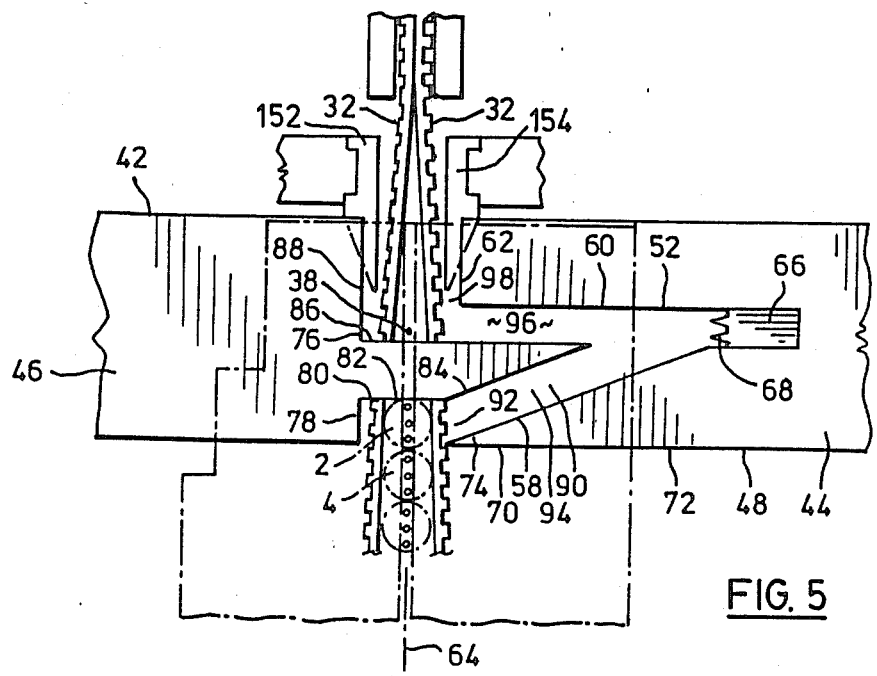
Figure 6:
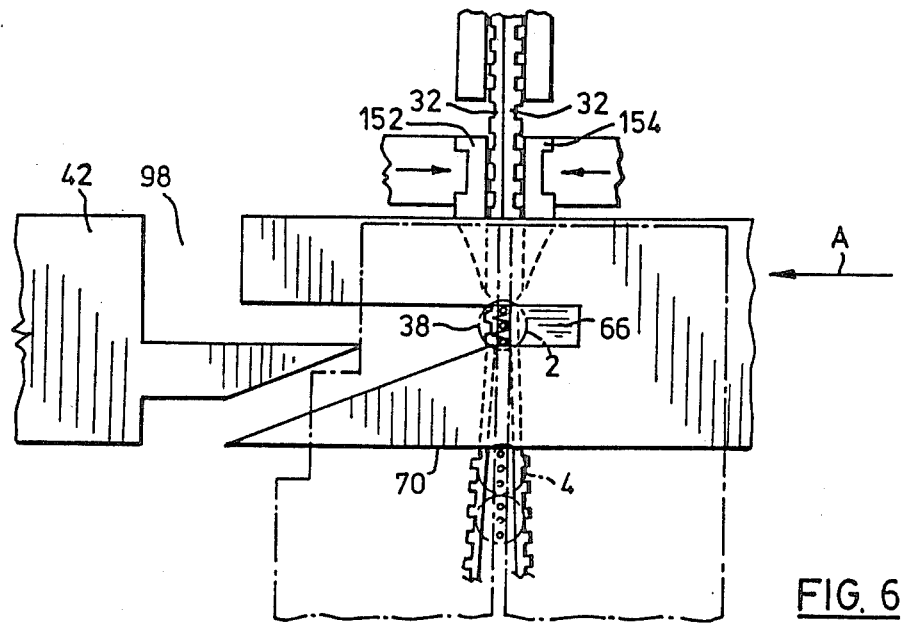
Figure 7:
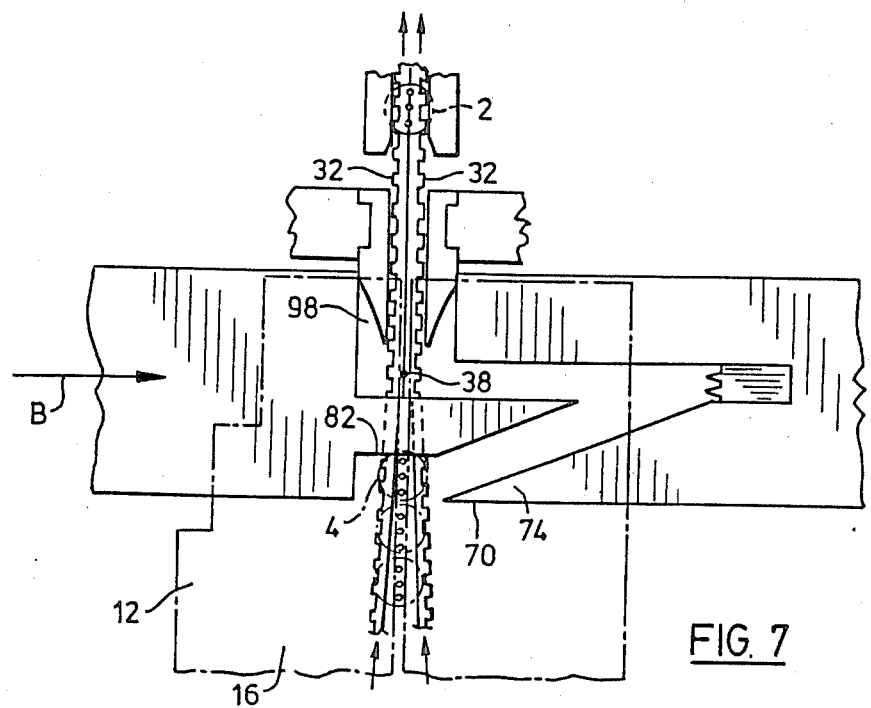
Figure 8:
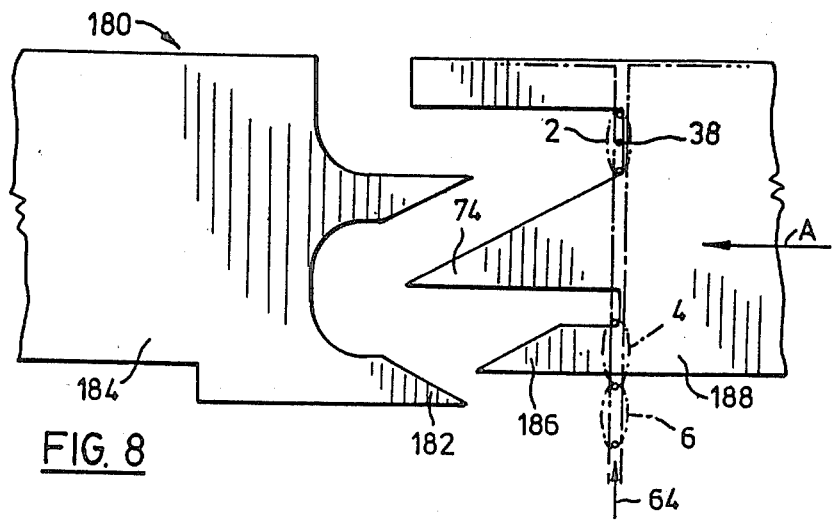
Figure 9:
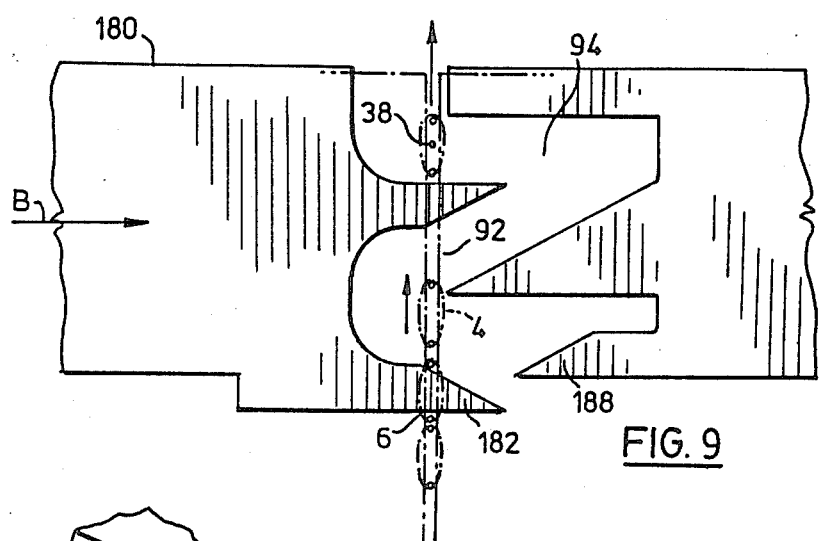
Figure 10:
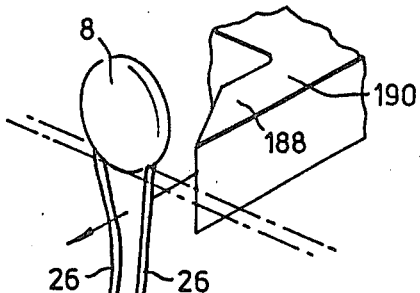
Figure 11:
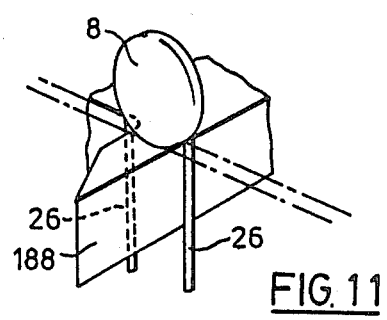

The invention will be more clearly understood after reference to the following detailed specification read in conjunction with the drawings wherein;

FIG. 1 is a pictorial view of a spacer mechanism constructed in accordance with an embodiment of the present invention, FIG. 2 is a detailed pictorial view of the shuttle of the spacer mechanism of FIG. 1, FIG. 3 is a partially sectioned pictorial view of the belt pinching mechanism, FIG. 4 is a partially sectioned pictorial view of a telescoping pin suitable for use in providing for a compression of the pinching arms of the pinch mechanism of FIG. 3, FIG. 5 is a plan view showing the shuttle mechanism in a first position, FIG. 6 is a plan view similar to FIG. 5 showing a second position of the shuttle, FIG. 7 is a view similar to FIG. 6 showing the return of the shuttle to the first position, FIG. 8 is a plan view similar to FIG. 5 showing a modified shuttle construction in which the shuttle is located in its second position, FIG. 9 is a view of the shuttle of FIG. 1 in its first position, FIG. 10 is a pictorial view showing the lead straightening tooth of FIG. 9 prior to entry between the leads of a component, FIG. 11 is a pictorial view showing the lead straightening tooth extending between the leads of component.

With reference to FIG. 1 of the drawings, the reference numeral 10 refers generally to a spacer mechanism constructed in accordance with an embodiment of the present invention. A feeder 12 serves to feed a single file column of electronic components 14 into the feeder mechanism. The feeder 12 comprises a vibrating slide 16 which has a slipway channel 18 extending longitudinally thereof. When used for the purposes of feeding components such as those illustrated in FIG. 14 in which the body portion 20 is of a generally cylindrical shape, a tilt preventing rail 22 is supported above the slide 16 in alignment with the slipway slot 18 by brackets 24 which are adjustably secured with respect to the slide 16 to provide for height adjustment.

The vibrating slide 16 is a conventional vibrating slide which is slightly downwardly inclined toward the spacer mechanism and serves to cause the column of components to advance toward the spacer mechanism.

The electronic components 14 each have a body portion 12 and at least one lead wire 26 extending from the body portion 14. The bottom wall 28 of the vibrating slide 16 is preferably a thin wall so that the leads 26 will be exposed below the slide 16 at a point closely adjacent their body portion 14 such that at the point at which the leads emerge from the slot, their misalignment is minimized.

The belt transporting mechanism 30 which is described in detail in U.S. application Ser. No. 822,635, the specification of which is incorporated herein by reference, the belt transporting mechanism includes a pair of flexible belts 32 which extend around sprockets 34 and have forward run portions 36 which, when the pinching mechanism is disengaged, are spaced from one another and converge toward the pick-off point 38 at which point the pinching mechanism which will be described hereinafter serves to pinch the belts together to engage the leads of a component. The vibrating slide 16 serves to advance the components along a path which extends to the pick-off point 38.

The shuttle assembly which is generally identified by the reference numeral 40 includes a shuttle 42 which will now be described with reference to FIG. 2 of the drawings. The shuttle 42 comprises a first shuttle member 44 and a second shuttle member 46 which are disposed directly opposite one another. The shuttle members 42 and 46 each have an upstream end 48 and a downstream end 50. A through passage 54 extends from the upstream end 48 to the downstream end 50. A first side wall of the through passage is generally identified by the reference numeral 52 and is formed on the first shuttle member 44. A second side wall of a through passage 54 is generally identified by the reference numeral 56 and is formed on the second shuttle member 46.

As shown in FIG. 5 of the drawings, the first side wall 52 includes a first angularly inclined face 58, a second laterally extending face 60 and a longitudinally extending face 62. A replaceable lead forming die 66 is located at the end of the first angularly inclined face 58 and is formed with a plurality of teeth 68 which are arranged to extend between adjacent leads and which serve to straighten and align the leads when the shuttle 42 moves from the first position shown in FIG. 5 to the second position shown in FIG. 6.

The first shuttle member 44 also has a first stop 70 formed on the first stop face 72 which extends transversely across the upstream end 48 of the first member 44. The first angularly inclined face 58 converges with the first stop face 72 to form a sharp lead spacing wedge 74 which is arranged to pass between the leads of the leading component and the leads of the next following component as the shuttle moves from the first position shown in FIG. 5 to the second position shown in FIG. 2. To ensure that the lead spacing wedge 74 will initially extend between the leads at a point adjacent the upper ends of the leads, I form the leading edge 71 (FIG.2) so that it is inclined downwardly and rearwardly to ensure that the wedge 74 is pointed at its upper end.

The second shuttle member 46 has a second side wall 76 which includes a longitudinally extending portion 78 which extends to a transversely extending second stop face 80 which serves to provide a second stop 82 which extends transversely of the path 64 when the shuttle is in the first position shown in FIG. 5. The second side wall 76 also includes a second angularly inclined portion 84 which extends in a spaced parallel relationship with respect to the angularly inclined portion 58. A second transversely extending face 86 extends parallel to and opposite the first laterally extending face 60. A third longitudinal face 88 extends opposite and parallel to the longitudinal face 62. The first side wall 52 and a second side wall 76 cooperate to define therebetween a through passage which is generally identified by the reference numeral 90. The through passage 90 has an entranceway 92 which opens laterally toward the leading component to of the column of components, the forward motion of which is arrested by the second stop 82 when the shuttle 42 is in the first position shown in FIG. 5. The through passage 92 includes an angularly inclined portion 94 followed by a transversely extending portion 96 and a longitudinally extending portion 98.

The first shuttle member 44 and the second shuttle member 46 are mounted in a spaced relationship required to provide the through passage 90 by means of a bridge member which is generally identified by the reference numeral 100 (FIG. 1). The bridge member 50 has a pair of mounting lugs 102, each formed with a U-shaped notch 104 which opens downwardly therefrom and which is closed by a removable base plate 106. A passage 108 extends through the top wall of the lug 102 and opens into the notch 104. A locking ball 110 is urged toward a recess 112 in the upper surface of each shuttle member by means of a compression spring 114 which is retained in the passage 108 by a threaded screw 116. The ball 112 is secured to the lower end of the compression spring so that it will not fall freely when one shuttle member is removed to be replaced by another shuttle member. This ball and socket construction facilitates the removal and replacement of one shuttle member with another shuttle member to accomodate components of different size and configuration. The bridge member 100 serves to maintain the first and second shuttle members in the required spaced relationship to provide the through passage 90. The bridge member 100 is releaseably mounted on a slide block 118 (FIG.1).

A nut 120 is threadedly mounted on a shaft (now shown) which projects from the slide block 118 through the bridge plate 101. Dowel pins 122 are mounted in the slide block 118 and project through alignment passages formed in the bridge plate 101. To remove the bridge plate 101 it is merely necessary to unscrew the nut 120 and withdraw the bridge plate 101 from the slide block 118. The slide block 118 is slidably mounted on a pair of spaced parallel guide rods 124 which are in turn mounted on a support bracket 126. The support bracket 126 is mounted on the base plate 128 of the lead forming machine.

In order to cause the slide block 118 to reciprocate, a rotary cam wheel 130 is provided. The cam wheel 130 is mounted for rotation with a shaft 132 directly below the slide block 118. A cam track 134 is formed in the upper face of the cam wheel 130 and extends about the shaft 132. A cam follower pin 136 extends downwardly from the slide block 118 into the cam track 134. The cam track 134 is shaped such that rotation of the cam wheel 130 will cause the bridge member to reciprocate to and fro to move the shuttle between the first and second positions as will be described hereinafter. The cam wheel 130 is drivingly connected to the power train which serves to drive the belts 132 such that the operation of the shuttle is syncronized with the operation of the lead transporting belts 32.

The belt pinching mechanism 140 will now be described with reference to FIG. 3 of the drawings. As shown in FIG. 3 of the drawings, the belt pinching mechanism 140 includes a housing block 142 which is mounted on the base plate 128. The housing block 142 has through passages 144 and 146 extending therethrough. A first pinch arm 148 is slidably mounted in the passage 144 and a second pinching 150 is slidably mounted in the passage 146. A first jaw 152 is mounted at one end of the arm 148 and a second jaw 154 is mounted directly opposite the first jaw 152 on a bracket 156 which extends upwardly from the second pinching arm 150. A cam wheel 158 is mounted on a drive shaft 160 for rotation therewith and is formed with eccentric cam tracks 162 and 164 on the upper and lower surfaces thereof respectively. Cam follower pins 166 and 168 are mounted on the first pinching arm 148 and second pinching arm 150 respectively and extend into the cam tracks 162 and 164 respectively. By rotating the cam wheel 158, the first and second jaws 152 and 154 are caused to move toward and away from one another.

In order to prevent the application of an excessive pinching load to the belts, the arm 148 is formed in two segments, 148a and 148b which are notched so as to interlock with one another while being free to telescope with respect to one another. An extension pin assembly 170 is mounted in a passage formed in the segment 148a and has a pin 172 projecting from one end thereof which is arranged to bear against the end face 148c of the notch formed in the segment 148b. As shown in FIG. 4 of the drawings, the pin 172 is mounted in a passage 174 which is formed in the threaded body 176 of the pin assembly 170. A compression spring 178 is mounted in the passage 174 and serves to urge the pin 172 to the extended position.

The method of operation of the shuttle assembly 40 will now be described with reference to FIGS. 1, 5, 6 and 7 of the drawings. When the rotary cam wheel 130 is in the position shown in FIG. 1 of the drawings, the shuttle 42 will be located in its first position which is shown in FIG. 5 of the drawings. When the shuttle 42 is in this first position, the cam wheel 158 of the belt pinching mechanism 140 is located in the position shown in FIG. 3 of the drawings such that the jaws 152 and 154 are located in the open position shown in FIG. 5. When the jaws 152 and 154 are in this open position, the belts 32 are spaced from one another at the pick-off point 38 to an extent sufficient to permit free movement of the leading component 2 to the pick-off point 38.

As shown in FIG. 5 of the drawings, when the shuttle 42 is in the first postion, the leading component 2 of the column of components will advance along the path 64 until its first lead comes in contact with the second stop 82. Movement of the cam wheel 130 will cause the shuttle 42 to move in the direction of the arrow A (FIG. 6) from the position shown in FIG. 5 toward the second position shown in FIG. 6. The initial result of the movement of the shuttle is that the entranceway 92 to the passage 90 and the lead spacing wedge will be moved toward the leading component 2. Further movement will cause the lead spacing wedge 74 to extend between the trailing lead of the leading component 2 and the leading lead of the next following component 4. Continued movement of the wedge 42 toward the second position will cause the first angularly inclined face 58 to engage the leading component and drive it forwardly along the path 64 while the next following component 4 will bear against the first stop 70. When the leading component 2 has been advanced to the position shown in FIG. 6 of the drawings, its lead wires will be located between the teeth 68 of the straightening insert 68 and will be straightened by contact therewith so as to extend parallel to one another if they were not correctly aligned when originally engaged by the lead forming die 66.

The shuttle 42 will assume the second position shown in FIG. 2 when the cam wheel 130 has rotated through 180°. It will be noted that the cam track 134 is arranged so that when the cam wheel 130 rotates at a uniform rotational speed, the lateral movement of the shuttle will be caused to accelerate as it approaches the second position by which time the leading component 2 is close to being aligned with the transverse portion 96 of the through passage 90. The rotation of the cam wheel 158 of the belt pinching mechanism 140 is synchronized with respect to the rotation of the cam wheel 130 so as to cause the jaws 152 and 154 to pinch the belts 32 to the closed position after the leading component 2 has arrived at the pick-off point 38 on the path 64.

Further rotation of the cam wheel 130 will cause the shuttle 42 to begin to move in the direction of the arrow B (FIG. 7) to return to the first position. When the shuttle 42 has been withdrawn from the second position to the point where the leading component 2 is aligned with the longitudinally extending portion 98 of the through passage, the belts 32 are activated to drive the leading component away from the the pick-off point 38 to assume the position shown in FIG. 7 in which the leading component 2 is spaced a substantial distance in advance of the pick-off point 38. Simultaneously, when the lead spacing wedge 74 is withdrawn to a sufficient extent that the first stop 74 is out of engagement with the leads of the next following component, the vibrating slide 16 of the feeder 12 will be effective in advancing the next following component 4 into contact with the second stop 82 so as to assume the position vacated by the previous leading component 2. The spacing process can then be repeated as previously described to locate the next following component 4 at the pick-off point 38 to thereby space successive components along the load transporting belts 32 at the required spaced intervals.

Various modifications of the present invention will be apparent to those skilled in the art. One modified shuttle structure is illustrated in FIGS. 8 and 9 of the drawings, in which like numerals are applied to like parts to those described in the preceding drawings. The shuttle 180 which is illustrated in FIGS. 8 and 9 of the drawings, is distinguished from the shuttle 42 by the provision of a first tooth 182 which is formed on the second shuttle member 184 and a second tooth 186 which is formed on the first shuttle member 188. The first tooth 182 is arranged to pass between the leads of the component 6 which is located in the path 64 while the second tooth 184 extends between the leads of the component 4 at the point where the component 2 is located at the pick-off point 38 along the path 64. FIG. 8 shows the positions of the components 2, 4 and 6 when the shuttle 180 is in the first position. As the shuttle moves toward the second position shown in FIG. 9, the tooth 188 will be withdrawn from the component 4 and the component 4 will begin to advance along the path 64 under the influence of the vibrating feeder until it is lined with the entranceway 90 of the through passage 94 after which the progress of the component 4 to the pick-off point 38 will be the same as that previously described with reference to FIGS. 5 to 6 of the drawings. The movement of the shuttle 180 to the second position shown in FIG. 9, causes the tooth 182 to pass between the leads of the component 6 and this serves to arrest forward movement of the component 6. Movement of the shuttle 180 in the direction of the arrow A will cause the tooth 182 to be withdrawn from the component 6 while the tooth 188 will move between the leads of the component 6 so that the component 6 will eventually assume the position of the component 4 illustrated in FIG. 8.

As shown in FIGS. 10 and 11 of the drawings, the tooth 188 is wedge-shaped to facilitate its entry between the lead wires 26 of the component 8 while the shank portion 190 of the tooth 188 is straight-sided so that it will urge the leads 26 to the straight aligned position shown in FIG. 11. In this embodiment, the tooth 188 performs the same function as the straightening die 66. These and other modifications of the present invention will be apparent to those skilled in the art.

I claim:

1. A spacer for spacing the leading component of a single file column of electronic components from the following component as the components are advanced by a feeder along a path which extends to a pick-off point of a component handling machine, each electronic component having a body portion and lead wire means projecting from the body portion below the feeder, said spacer comprising;
    (a) a shuttle mounted below and located adjacent said feeder for reciprocating movement across said path between a first position and a second position, said shuttle having an upstream end and a downstream end spaced from the advancing column of components,
    (b) a first stop on said shuttle arranged to extend across said path to stop the advance of said next following component at a first point as said shuttle moves from its first position to its second position and back to its first position,
    (c) a second stop on said shuttle arranged to extend across said path when said shuttle is in said first position, to stop the advance of said leading component at a second point which is located downstream of said first point,
    (d) a passage opening through said shuttle to permit passage of the leading component from said first point to said pick-off point, said passage having a first angularly inclined face arranged to engage the lead wire means of a leading component located at said second point as said shuttle moves from its first position to its second position to advance said leading component from said second point to said pick-off point to space it from the next following component.

2. A spacer as claimed in claim 1, wherein said first stop is in the form of a first stop face that extends transversely across said shuttle and converges with said first angularly inclined face of said passage to form a lead spacing wedge arranged to pass between the lead means of the leading component and the lead means of the next following component closely adjacent the feeder.

3. A spacer as claimed in claim 2, wherein the feeder is in the form of a slide which has a thin bottom wall in which a feeding slot is formed to receive the lead means of the components such that the lead spacing wedge makes contact with the lead means closely adjacent their associated body portions which serve to space the lead means from one another.

4. A spacer for spacing electronic components as claimed in claim 1, wherein said passage has an entranceway at its upstream end opening laterally toward said second position to receive a component located in said second position when said shuttle is in its first position.

5. A spacer as claimed in claim 1, wherein lead straightening means is located in said passage downstream of said first angularly inclined face, said straightening means being arranged to bear against the lead means of the leading component when it is advanced to said pick-off point to apply a straightening load thereto.

6. A spacer as claimed in claim 1, wherein said passage has a second angularly inclined face located downstream from and disposed opposite said first angularly inclined face, said second angularly inclined face serving to prevent direct passage of said leading component from said second point to said pick-off point.

7. A spacer as claimed in claim 1, wherein said passage has a first angularly inclined section extending from an entranceway that opens laterally toward said first point, to the downstream end of said first inclined face and a second section that extends laterally from the downstream end toward said pick-off point and an exit which opens in the downstream direction.

8. A spacer as claimed in claim 1 for spacing components which have two leads projecting downwardly from their body portion, said passage having first and second side walls on opposite sides thereof, said angularly inclined face being formed on said first side wall, said first stop comprising;
    (a) a first pick-off tooth formed on said second side wall and projecting laterally toward said path in a first direction, said tooth projecting across said path when said shuttle is in said first position to extend between the leads of the next following component to stop its advance as aforesaid.

9. A spacer as claimed in claim 8, wherein said first stop includes a second tooth formed on said first side wall downstream from said first tooth and upstream from said inclined face, said second tooth projecting laterally towards said path in a second direction opposite said first direction, said second tooth being spaced from said path when said shuttle is in said first position and extending across said path when said shuttle is in said second position, said second tooth being proportioned to extend between and straighten the leads of said next following component when said shuttle is in said second position.

10. A spacer as claimed in claim 1, further comprising a pair of lead transporting belts arranged one on either side of said path, said lead transporting belt being mounted for longitudinal movement along said path and extending toward and beyond said pick-off point, said transporting belts being normally spaced from one another at said pick-off point and pinching means arranged downstream of said pick-off point for moving said belts toward and away from one another to clamp the leads of the leading component therebetween for subsequent movement away from said pick-off point in use.

11. A spacer as claimed in claim 10, wherein said shuttle comprises first and second members arranged one on either side of said through passage.

12. A spacer as claimed in claim 11, further comprising a bridge member supporting said first and second members at opposite sides of said passage.

13. A spacer as claimed in claim 12, further comprising slide means slidably supporting said bridge means to guide the lateral movement of said shuttle.

* * * * *